United States Patent [19]

Anjum et al.

[11] Patent Number: 5,393,676
[45] Date of Patent: Feb. 28, 1995

[54] METHOD OF FABRICATING SEMICONDUCTOR GATE ELECTRODE WITH FLUORINE MIGRATION BARRIER

[75] Inventors: Mohammed Anjum; Ibrahim K. Burki, both of Austin; Craig W. Christian, Buda, all of Tex.

[73] Assignee: Advanced Micro Devices, Inc., Sunnyvale, Calif.

[21] Appl. No.: 125,421

[22] Filed: Sep. 22, 1993

[51] Int. Cl.⁶ .......................... H01L 21/265
[52] U.S. Cl. ...................... 437/24; 437/29; 437/46; 437/41
[58] Field of Search ............ 437/24, 41, 29, 46

[56] References Cited

U.S. PATENT DOCUMENTS

| | | | |
|---|---|---|---|
| 4,371,403 | 2/1983 | Ikubo et al. | 148/1.5 |
| 4,764,478 | 8/1988 | Hiruta | 437/29 |
| 4,814,292 | 3/1989 | Sasaki et al. | 437/101 |
| 4,818,711 | 4/1989 | Choksi et al. | 437/21 |
| 4,851,359 | 7/1989 | Boudou et al. | 437/24 |
| 5,124,272 | 6/1992 | Saito et al. | 437/41 |
| 5,147,826 | 9/1992 | Liu et al. | 437/233 |

FOREIGN PATENT DOCUMENTS

| | | |
|---|---|---|
| 86-107811 | 10/1984 | European Pat. Off. |
| 2185642 | 7/1987 | Germany |
| 63-299328 | 12/1988 | Japan |

OTHER PUBLICATIONS

Wright et al., "The Effect of Fluorine in Silicon Dioxide Gate Dielectrics", *IEEE*, (1989), pp. 879–889.
Sung et al., "A Comprehensive Study on p+ Polysilicon-Gate MOSFET's Instability with Fluorine Incorporation", *IEEE*, (1990), pp. 2312–2320.
Hsieh et al., "Characteristics of MOS Capacitors of $BF_2$ or Implanted Polysilicon Gate with and without $POCl_3$ Co-doped", *IEEE*, (1993), pp. 222–224.

*Primary Examiner*—George Fourson
*Assistant Examiner*—David M. Mason
*Attorney, Agent, or Firm*—Kevin L. Daffer

[57] ABSTRACT

A PMOS device is provided having a diffusion barrier placed within a polysilicon gate material. The diffusion barrier is purposefully implanted to a deeper depth within the gate material than subsequently placed impurity dopants. The barrier comprises Ar atoms placed in fairly close proximity to one another within the gate conductor, and the impurity dopant comprises ions of $BF_2$. F from the impurity dopant of $BF_2$ is prevented from diffusing to underlying silicon-oxide bonds residing within the oxide bulk. By minimizing F migration to the bond sites, the present polysilicon barrier and method of manufacture can minimize oxygen dislodgment and recombination at the interface regions between the polysilicon and the gate oxide as well as between the gate oxide and silicon substrate.

13 Claims, 3 Drawing Sheets

METHOD OF FABRICATING SEMICONDUCTOR GATE ELECTRODE WITH FLUORINE MIGRATION BARRIER

BACKGROUND OF THE INVENTION

1. Field of the Invention

This invention relates to semiconductor processing and more particularly to a semiconductor gate conductor which minimizes oxygen recombination at polysilicon/gate oxide and also at gate oxide/silicon substrate interface regions.

2. Background of the Relevant Art

Fabrication of a MOSFET device is well known. Generally speaking, MOSFETs are manufactured by placing a undoped polycrystalline material or "polysilicon" material over a relatively thin gate oxide, and implanting the polysilicon and adjacent source/drain regions with an impurity dopant material. Alternatively, the polysilicon can be diffusion doped prior to gate definition and source/drain implants. As defined herein, "gate conductor" refers to polysilicon material which has received an impurity implant and subsequent anneal necessary to activate the polysilicon to a conductive state. After polysilicon has received a dopant such as arsenic or boron, it becomes a gate conductor capable of providing a conduit for minority carrier movement.

It is well known that polysilicon material, which receives p+ dopants necessary to form PMOS devices, is more sensitive than the counterpart polysilicon used for NMOS devices. In CMOS manufacture embodying both PMOS and NMOS devices, it is important that the polysilicon overlying PMOS devices be carefully controlled during the anneal process. P+ dopants such as boron (B) can penetrate through the polysilicon, through the underlying gate oxide, and into the underlying silicon substrate or channel region. P+ dopants such as $BF_2$ can dissiminate into B and fluorine (F), wherein B diffuses into the underlying silicon, but F diffuses only to the polysilicon/oxide and oxide/silicon interfaces. B dopants within the channel region can shift the threshold voltage (Vth) or the flat band voltage (Vfb) of the resulting PMOS device. In order to prevent B penetration (of B or $BF_2$ dopant) into the underlying channel region, many manufactures maintain the hydrogen concentration in the annealing furnaces as low as possible. See, e.g., Sung, et al., "A Comprehensive Study on p+ Polysilicon-Gate MOSFET's Instability With Fluorine Incorporation", *IEEE Trans. on Electron Devices*, Vol. 37, No. 11, (November, 1990).

Doping the PMOS device polysilicon with B or $BF_2$ implant material allows the resulting device to operate as a surface channel device rather than a buried channel device. The advantages of surface channel operation are: relieving short channel effects, and superior turn-off and turn-on characteristics. PMOS devices are typically fabricated in CMOS technology by implanting either B or $BF_2$ into the polysilicon overlying the devices, followed by anneal. Due to $BF_2$ having a larger atomic mass than B, $BF_2$ is preferred material for achieving shallow source/drain junctions. Given the same electron-volt implant energy expended by the implant device, the larger atomic mass of $BF_2$ will be driven to a lesser depth into the polysilicon and surrounding source/drain regions than B. The work function difference between a p+ gate and the underlying n-well is such that a surface channel PMOS device is realized.

Although $BF_2$ is a mainstay in shallow junction/shallow channel PMOS fabrication for reasons stated hereinabove, fluorine (F) associated with $BF_2$ can present numerous problems. Recent studies have indicated that F is highly mobile at the grain boundary sites of the polysilicon as well as within the underlying gate oxide. Enhanced diffusion along grain boundaries and interstitialcy movement within the underlying gate oxide allows F atoms to quickly travel to, and bond to, dangling or weakened bonds at the juncture between the oxide and the overlying polysilicon as well as at the juncture between the oxide and underlying silicon substrate. See, e.g., Wright, et al., "The Effect of Fluorine in Silicon Dioxide Gate Dielectrics", *IEEE Trans. on Electron Devices*, Vol 36, No. 5 (May, 1989). After the junctures or interface regions have been saturated with F, additional incorporation of F occurs primarily in the bulk of the oxide. As proposed by the article to Wright, et al., mobile F atoms appear to break the silicon-oxygen bonds and displace oxygen at the bond sites. The free oxygen (O) diffuses to the interface regions and oxidizes additional silicon therein. Oxide thickening is therefore a natural result of this phenomenon.

Referring now to FIG. 1, a cross-sectional view of a semiconductor substrate 10 is shown embodying a patterned PMOS device 14. Device 14 is placed between field oxides 16 and is configured to receive $BF_2$ dopant ions. In particular, $BF_2$ dopant ions are deposited within polysilicon material 18 and within adjacent source/drain regions 20 according to the well known self-aligned process. Spacers 22 can be employed to provide lightly doped drain regions, also well known to the skilled artisan.

As indicated by arrows 24, F associated with $BF_2$ ions readily migrate or diffuse toward gate oxide material 26 from their initial deposit location within polysilicon 18. Weak silicon-oxygen bonds, at the interface regions between polysilicon 18 and oxide 26 as well as at the interface regions between oxide 26 and substrate 10, accept the mobile F atoms at the weakened bond sites.

Referring now to FIG. 2, a cross-sectional view of substrate 10, field oxide 16 and polysilicon 18 is shown. Furthermore, a thickened or enhanced gate oxide 26 is shown resulting from mobile F atoms dislodging oxygen at the silicon-oxygen bond sites, and the dislodged oxygen recombining at the interface regions. Recombination of oxygen with adjacent silicon at the interface regions causes growth or thickening of gate oxide 26 and the deleterious effects associated therewith.

Referring now to FIG. 3, a graph of concentration versus depth of F and O atoms within polysilicon 18, gate oxide 26 and substrate 10 is shown. Specifically, F atoms are illustrated as being highly mobile throughout polysilicon from their introduction point near the surface of the polysilicon through grain boundary locations and to underlying gate oxide 26. Interstitialcy movement of F atoms allow the atoms to initially concentrate at the interface regions thereby drawing free oxygen atoms from bonds at those regions which recombine to form thickened oxide. High level concentration of F atoms must thereby be controlled and minimized in the gate oxide area and, preferably, F should be reduced much lower than O concentration in the gate oxide so as to prevent recombination and dislodgment.

The displacement of O to the interface sites increases (i.e., thickens) gate oxide, leading to higher Vth, skewed Vfb, and slower gate operation. The displaced oxygen atom and resulting dangling bond on the silicon atom within the channel region underlying the oxide can act as a hole trap which would further deteriorate PMOS switching operation.

A proposed solution to alleviating the mobility of F and the problems associated therewith is to co-dope the $BF_2$ implanted polysilicon with $POCl_3$. Phosphorous within the $POCl_3$ can act as a physical barrier by blocking available F diffusion sites at the interface regions. A result being a gate oxide region which does not thicken when F is introduced into the overlying polysilicon. See, e.g., Hsieh, et al., "Characteristics of MOS Capacitors of $BF_2$ or B Implanted Polysilicon Gate With and Without $POCl_3$ Co-doped", *IEEE Electron Device Letters*, Vol 14, No. 5 (May, 1993).

While $POCl_3$ appears to have encouraging results, the method for introducing $POCl_3$ is somewhat impractical under current CMOS manufacturing constraints. The proposed $POCl_3$ material is primarily diffused only within PMOS regions. In order for $POCl_3$ to be used with current CMOS processes, a masking step and blocking photoresist is required to prevent the $POCl_3$ from entering the NMOS active regions. Since $POCl_3$ is normally introduced by thermal diffusion, it is impractical for the blocking photoresist to be introduced into a high temperature diffusion furnace in order to selectively diffuse only the PMOS regions. Accordingly, studies into $POCl_3$ barrier materials are generally limited to circuits which employ only PMOS devices. CMOS devices having the advantages of a F barrier cannot, as a practical matter, be formed using current $POCl_3$ techniques.

It would be advantageous to provide a F barrier material which can be used to manufacture a CMOS device. The barrier material chosen must be capable of presenting a physical barrier at the polysilicon/gate oxide interface in order to minimize intertitialcy diffusion therein. The barrier material must also be capable of "stuffing" the grain boundaries in the polysilicon in order to decrease the rate of fluorine diffusion along the polysilicon grain boundaries. The barrier material must further be available in conventional processing devices and, once deposited, must not significantly trap mobility carriers within the polysilicon during gate operation.

SUMMARY OF THE INVENTION

The problems outlined above are in large part solved by the semiconductor gate conductor of the present invention. Polysilicon, which is rendered a gate conductor by doping it with $BF_2$, achieves the advantages of shallow junction/surface channel operability. Prior to receiving $BF_2$ dopant, the polysilicon material is implanted with argon (Ar) ions to a controlled depth. The Ar ions are placed deeper within the polysilicon than a majority of the $BF_2$ ions.

The Ar ions can be blanket implanted across the entire surface of the polysilicon material. Separate masks and/or processing steps, including blocking photoresist, are not needed to manufacture a CMOS circuit utilizing the PMOS device hereof. After photoresist and etch, Ar-implanted polysilicon is ready to accept p+ ($BF_2$) dopant in accordance with the self-aligned, shallow implant process. The only change in the normal processing flow is the non-masked introduction of Ar into the polysilicon-coated wafer. Blanket implantation of Ar can be more easily achieved and more accurately defined than select implantation through implant windows. Moreover, Ar is a well known inert material already present within many thermal diffusion chambers or ion implantation devices. Conventional implantation equipment utilizing existing Ar can therefore be used without retrofitting the equipment or inserting unconventional chemical compounds within the equipment chambers. Ar is well recognized and available in all commercial implanters. Although other noble gases can be used by the implanters as a barrier material, the noble gas chosen must be connected to the implanter before it can be used. Ar gas supply need not be connected since it is already present.

The Ar ions which are implanted to a deeper depth than the subsequent-placed $BF_2$ ions form a barrier only within the polysilicon material. The barrier exists between a majority of F ions (arising from $BF_2$) and the gate oxide. The Ar ions act as a F diffusion barrier by stuffing the grain boundary sites and combining with the dangling or weakened bonds in the oxide/polysilicon interface region. By stuffing the grain boundaries and by occupying the Si—O bonds within the polysilicon near the interface, Ar will substantially prevent F mobility to the underlying gate oxide, and will therefore minimize thickening of the gate oxide and the deleterious effects associated therewith.

Broadly speaking, the present invention contemplates a method for reducing the concentration of fluorine (F) from a semiconductor gate conductor to an underlying gate oxide. The method comprises the steps of providing a semiconductor substrate and a gate oxide across one surface of the substrate, and providing a polysilicon material across the gate oxide. Argon is then implanted into the polysilicon material to a concentration peak density at a first depth relative to the upper surface of the polysilicon material. Portions of the polysilicon material are then selectively removed to present a patterned polysilicon material, a source region and a drain region. After sidewall spacer formation, impurities can then be implanted into the source region, the drain region, and the patterned polysilicon material. The patterned polysilicon material receives impurities at a second depth relative to its upper surface in order to form the gate conductor. The second depth is shallower than the first depth.

Argon is implanted by ionizing elemental Ar and then placing the Ar ions into grain boundary locations within the polysilicon material. The Ar ions can also be placed within silicon-oxide bond locations within the polysilicon, near the polysilicon/gate oxide interface.

The Ar ions can be deposited into approximately a 4000 Å polysilicon layer. The Ar ions can be accelerated at a dose within the range of $1 \times 10^{13}$ atoms/cm$^2$ to $5 \times 10^{14}$ atoms/cm$^2$ at an implant energy not greater than 250 keV, whereby the first depth is approximately 2500 Å. The impurity material is preferably $BF_2$ ions. The $BF_2$ ions are accelerated at a dose within the range of $1 \times 10^{15}$ atoms/cm$^2$ to $8 \times 10^{15}$ atoms/cm$^2$ at an implant energy not greater than 80 keV, whereby the second depth is approximately 630 Å.

The present invention further contemplates a method for minimizing growth of gate oxide subsequent to deposition of overlying polysilicon material. The method comprises the steps of providing a gate oxide upon an n-type silicon substrate, and providing a polysilicon material across the gate oxide. $BF_2$ is implanted into the polysilicon material to a location having a concentration peak density. Prior to implanting the $BF_2$, Ar is implanted into the polysilicon material to a location having a concentration peak density of Ar which is between the oxide and the $BF_2$ concentration peak density location. The implanted Ar functions to minimize diffusion of F to the gate oxide. Further, by minimizing F at the gate oxide, Ar minimizes dislodgment of oxygen (O) and the movement of dislodged O atoms to the interface regions where they might recombine with silicon at the interface.

The present invention still further contemplates a polysilicon material. The polysilicon material is placed upon a gate oxide, wherein the combined polysilicon and gate oxide is placed upon a silicon substrate. Means is provided for implanting a plurality of Ar ions within the polysilicon material. The Ar ions are capable of diffusing to and occupying a respective plurality of silicon-oxygen bond sites within the polysilicon near a juncture between the polysilicon material and the gate oxide. Additional means is provided for implanting a plurality of $BF_2$ dopant ions within the polysilicon material, whereby F atoms within $BF_2$ are substantially prevented from bonding to the plurality of silicon-oxygen bond sites occupied by the Ar ions. F is further substantially prevented from dislodging O atoms at the bond sites toward the juncture between the polysilicon material and the gate oxide and toward the juncture between the gate oxide and the silicon substrate.

BRIEF DESCRIPTION OF THE DRAWINGS

Other objects and advantages of the invention will become apparent upon reading the following detailed description and upon reference to accompanying drawings in which.

Figure 1:
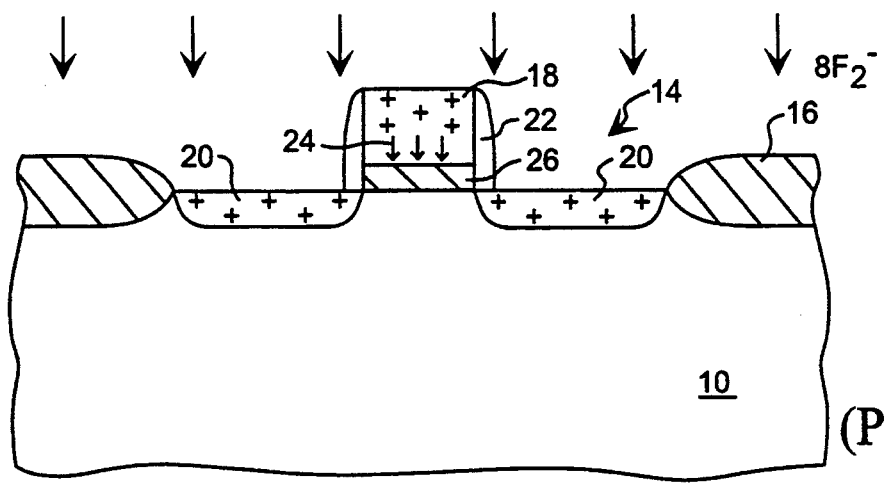
FIG. 1 is a cross-sectional view of a semiconductor substrate embodying a patterned PMOS device placed between field oxides and configured to receive $BF_2$ ions according to one step of a prior art manufacturing operation.
Figure 2:
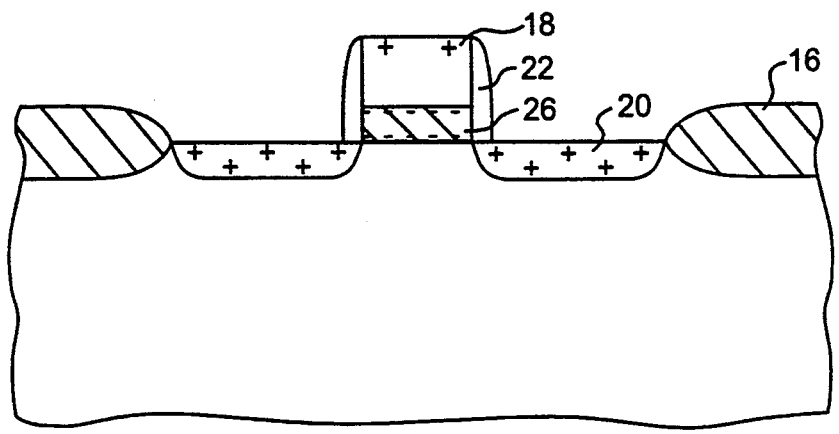
FIG. 2 is a cross-sectional view of a semiconductor substrate embodying a patterned PMOS device with thickened gate oxide resulting from another step of a prior art manufacturing operation.

While the invention is susceptible to various modifications and alternative forms, specific embodiments thereof are shown by way of example in the drawings and will herein be described in detail. It should be understood, however, that the drawings and description thereto and not intended to limit the invention to the particular forms disclosed, but on the contrary, the intention is to cover all modifications, equivalents and alternatives falling within the spirit and scope and the present invention as defined by the appended claims.

DETAILED DESCRIPTION OF THE INVENTION

Figure 4:
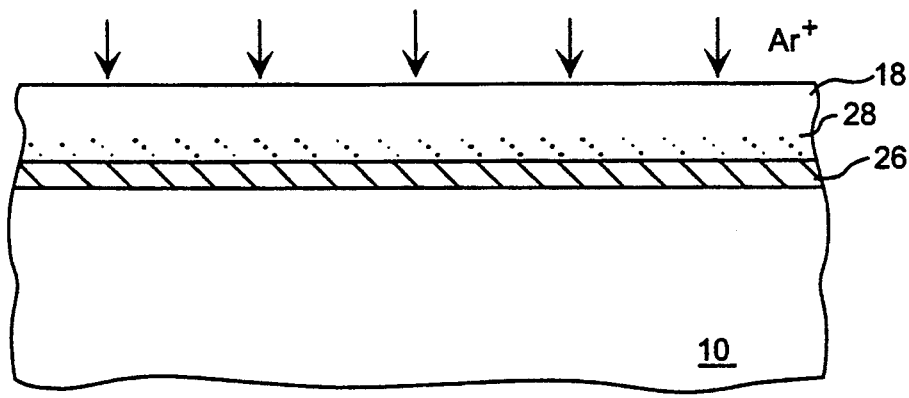
FIG. 4 is a cross-sectional view of a semiconductor substrate with gate oxide and overlying polysilicon configured to receive argon ions during a processing step according to the present invention.

Referring now to FIG. 4, a cross-sectional view of semiconductor substrate 10 is shown. Furthermore, a relatively thin gate oxide 26, preferably less than a hundred Angstroms, is placed across the upper surface of substrate 10 according to a normal thermal oxidation process. Substrate 10 is preferably a silicon crystalline material, and gate oxide 26 comprises silicon dioxide placed across a relatively planar upper surface of substrate 10. Placed across the entire surface of gate oxide 26 and adjacent field oxide 27 (not shown in FIG. 4 but shown in FIG. 5) is a polysilicon layer 18. Polysilicon 18 can be deposited according to normal thin film deposition techniques such as chemical vapor deposition (CVD) using, for example, atmospheric pressure or low pressure deposition chambers. Vapor deposition can be plasma enhanced, if necessary, to provide a high growth rate using an exemplary feed materials such as dichlorsilane and silane, well recognized in the art.

In order to form a PMOS device upon substrate 10, a barrier material must be implanted before entry of the p+ type dopant. Barrier material preferably comprises argon (Ar) ions normally found within the implant chamber as part of the inert carrier gas used for implanting polysilicon and/or cleaning the internal mechanism of the implanter. Ar is implanted from an ion implanter into the already deposited polysilicon. Ar thereby provides an inert species which, when implanted, minimizes disruption of the polycrystalline lattice/boundary structure. Implanted Ar ions are not as likely to disrupt and recombine with bonds within the polysilicon material as would be the case if non-inert materials were used.

Figure 5:
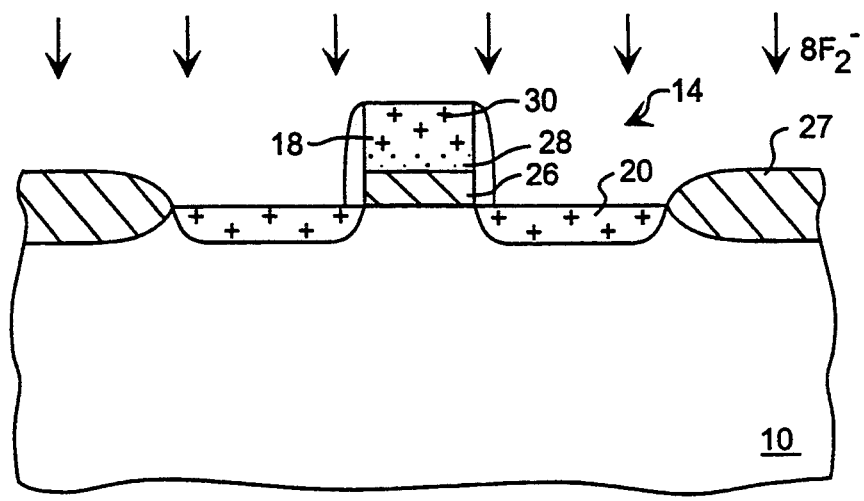
FIG. 5 is a cross-sectional view of a semiconductor substrate embodying a patterned PMOS device placed between field oxides and configured to receive $BF_2$ ions according to a subsequent processing step of the present invention.

Referring now to FIG. 5, Ar atoms 28 are implanted at a sufficient depth within polysilicon 18 such that a majority of the Ar atoms reside between subsequent implanted $BF_2$ ions and underlying gate oxide 26. Ar ions are therefore implanted at a first depth while $BF_2$ ions are implanted at a second depth, wherein the first depth is, on the average, deeper within polysilicon 18 than the second depth. Each of the plurality of ions (either Ar or $BF_2$ ions) comprise a concentration peak density. The concentration peak density of Ar ions is therefore shown at a first depth, while the concentration peak density of $BF_2$ is shown at a second depth. Ar atoms are somewhat mobile within polysilicon 18 and migrate or diffuse to the grain boundary locations and silicon-oxygen bond sites within polysilicon, near gate oxide 26.

By occupying the grain boundary locations (i.e., "stuffing" the grain boundary locations) and occupying the silicon-oxide weakened bond sites, Ar substantially minimizes the migration path which F would normally take during subsequent thermal cycles (or anneal). F is thereby prevented from entering the weakened bond areas and dislodging oxygen. Therefore, Ar ions 28 substantially prevent or minimize thickening of gate oxide 26 caused by recombination of the dislodged oxygen.

Figure 6:
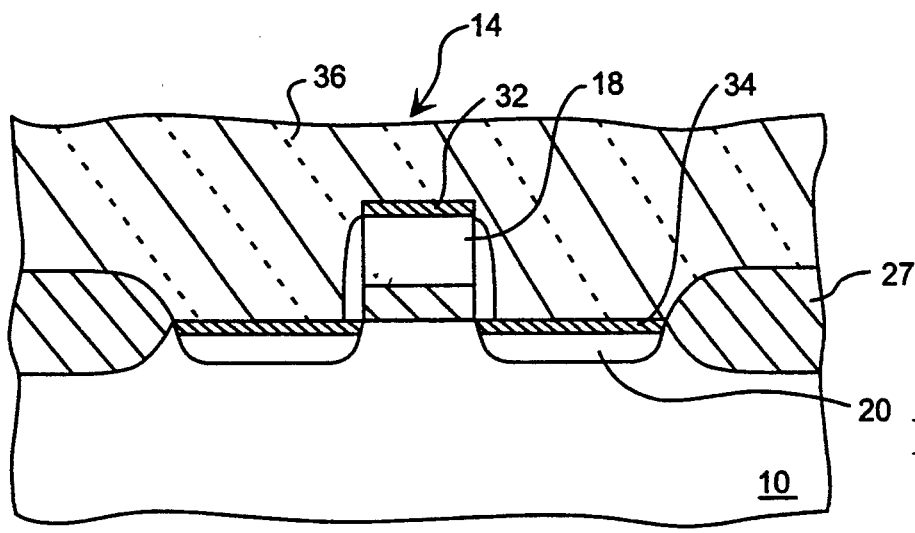
FIG. 6 is a cross-sectional view of a semiconductor substrate embodying a patterned PMOS device with silicide and overlying dielectric material formed according yet another subsequent processing step of the present invention.

Referring now to FIG. 6, a near final processing step of a PMOS device 14 is shown. Titanium silicide 32 can be placed on the upper surface of polysilicon 18 followed by normal salicide processing to enhance contact to overlying metallization. Alternatively, a tungsten silicide can be formed according to well known inorganic thin-film deposition processes using $WF_6$ decomposition. F from the tungsten silicide will not enter the underlying interface regions due to the Ar barrier placed within polysilicon 18. Thus, an important aspect of blanket implanting the Ar within polysilicon 18 is the ability of Ar to block subsequent placed dopant materials and silicides which use a F carrier material.

Further shown in FIG. 6 are silicide and metallization layers 34 placed upon source/drain regions 20 after source/drain anneal. A dielectric material 36 can also be placed over the existing topography to provide upper surface planarization and insulation between multi-layer metallization. During the cure of dielectric 36 (preferably an organic silicate such as alkoxysilane) simultaneous anneal of implant damage takes place within source/drain regions 20 and polysilicon 18.

Figure 3:
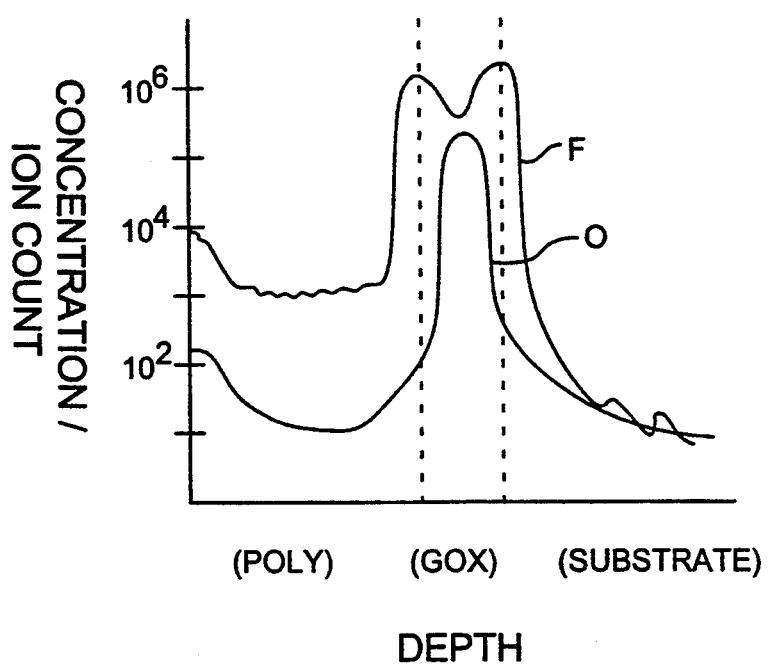
FIG. 3 is a graph illustrating concentration density versus depth of fluorine and oxygen ions diffused into a PMOS device manufactured according to a prior art manufacturing operation.
Figure 7:
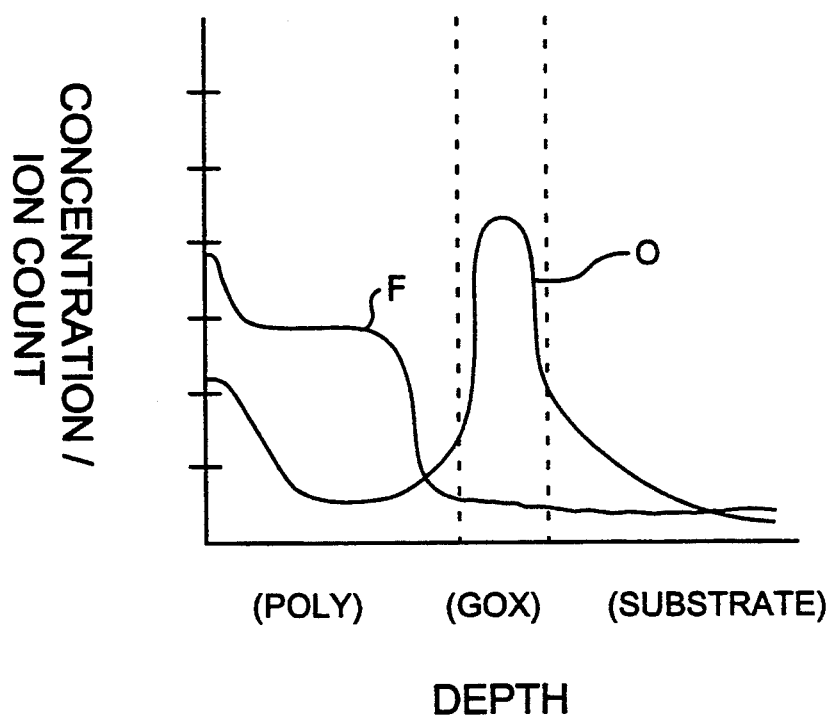
FIG. 7 is a graph illustrating concentration density versus depth of fluorine and oxygen in a PMOS device manufactured according to the present invention.

A graph illustrating concentration density versus depth of F and O within a PMOS device manufactured according to the present invention is shown in FIG. 7. In particular, a reduction in F concentration within the gate oxide is postulated to occur according to the curve so designated, primarily due to the Ar barrier. FIG. 7 is presented to illustrate a comparison between the F concentration of the present invention and F concentration of the prior art gate topography of FIG. 3. By minimizing F concentration within the gate oxide, oxygen dislodgment and recombination can be minimized as evidenced by a relative reduction in free O within gate oxide 26. FIG. 7, illustrates changes in F and O concentration for comparison purposes only. Absolute amounts are not necessary to explain the comparative advantages achieved by the present invention.

It will be appreciated to those skilled in the art having the benefit of this disclosure that this invention is believed to be capable PMOS or CMOS applications using $BF_2$ impurity dopant implant for surface channel and shallow source/drain operation. It is also to be understood that the form of the invention shown and described is to be taken as a presently preferred embodiment. Various modifications and changes may be made without departing from the spirit and scope of the invention as set forth in the claims. It is intended that the following claims be interpreted to embrace all such modifications and changes.

What is claimed is:

1. A method for reducing diffusion of fluorine from a semiconductor gate conductor to an underlying gate oxide, the method comprising the steps of:
   providing a semiconductor substrate and a gate oxide across one surface of said substrate;
   providing a polysilicon material across the gate oxide;
   implanting argon into the polysilicon material to form a concentration peak density at a first depth relative to the upper surface of said polysilicon material;
   selectively removing a portion of said polysilicon material to present a patterned polysilicon material, a source region and a drain region; and
   implanting impurities into said source region, said drain region and said patterned polysilicon material, wherein said patterned polysilicon receives said impurities at a second depth relative to the upper surface of said polysilicon material which is shallower than said first depth.

2. The method as recited in claim 1, wherein said semiconductor substrate comprises an n-type material and said impurities comprise $BF_2$ ions.

3. The method as recited in claim 1, further comprising the step of heating said patterned polysilicon material, said source region and said drain region to a temperature exceeding 800° C.

4. The method as recited in claim 1, wherein said step of implanting argon further comprises the steps of:
   ionizing elemental argon; and
   placing said argon ions into grain boundary locations within said polysilicon material and into silicon-oxide bond locations within said polysilicon material near the juncture between said polysilicon and said gate oxide.

5. The method as recited in claim 1, wherein said step of implanting argon further comprises the steps of:
   ionizing elemental argon; and
   accelerating the argon ions at a dose within the range of $1 \times 10^{13}$ atoms/cm$^2$ to $5 \times 10^{14}$ atoms/cm$^2$ at an implant energy less than 250 keV, whereby the second depth is approximately 2500 Å.

6. The method as recited in claim 1, wherein said step of implanting impurities further comprises the steps of:
   ionizing the compound of $BF_2$; and
   accelerating the $BF_2$ ions at a dose within the range of $1 \times 10^{15}$ atoms/cm$^2$ to $8 \times 10^{15}$ atoms/cm$^2$ at an implant energy less than 80 keV, whereby the second depth is approximately 630 Å.

7. A method for reducing diffusion of fluorine from a semiconductor gate conductor to an underlying gate oxide, the method comprising the steps of:
   providing a semiconductor n-type substrate and a gate oxide across one surface of said substrate;
   providing a polysilicon material across the gate oxide;
   implanting argon ions into grain boundary locations within said polysilicon material and into silicon-oxide bond locations within said polysilicon material near the juncture between said polysilicon and said gate oxide, said argon ions are further implanted to form concentration peak density within said polysilicon material, wherein said concentration peak density is at a first depth relative to the upper surface of said polysilicon material;
   selectively removing a portion of said polysilicon material to present a patterned polysilicon material, a source region and a drain region, said patterned polysilicon material having a thickness substantially equal to the thickness of said polysilicon material;
   implanting $BF_2$ ions into the source and drain regions simultaneous with implanting $BF_2$ ions into the patterned polysilicon to form a concentration peak density at a second depth within said patterned polysilicon material which is shallower than said first depth, wherein fluorine from said implanted $BF_2$ ions is substantially prevented from diffusing through said grain boundary locations and to said silicon-oxide bond locations due to the presence of argon at said locations; and
   heating said patterned polysilicon material, said source and said drain to a temperature sufficient to render conductive said patterned polysilicon material, said source and said drain.

8. The method as recited in claim 7, wherein said heating step comprises heating said patterned polysilicon material, said source and said drain to a temperature exceeding 800° C.

9. The method as recited in claim 7, wherein said step of implanting argon ions comprises further steps of:
ionizing elemental argon; and
accelerating the argon ions at a dose within the range of $1 \times 10^{13}$ atoms/cm$^2$ to $5 \times 10^{14}$ atoms/cm$^2$ at an implant energy less than 250 keV, whereby the first depth is approximately 2500 Å relative to the upper surface of said polysilicon.

10. The method as recited in claim 7, wherein said step of implanting impurities comprises further steps of:
ionizing said BF$_2$; and accelerating the BF$_2$ ions at a dose within the range of $1 \times 10^{15}$ atoms/cm$^2$ to $8 \times 10^{15}$ atoms/cm$^2$ at an implant energy less than 80 keV, whereby the second depth is approximately 630 Å relative to the upper surface of said polysilicon.

11. A method for minimizing growth of gate oxide comprising the steps of:
providing a gate oxide upon an n-type silicon substrate
providing a polysilicon material across said gate oxide;
implanting BF$_2$ into said polysilicon material to form a BF$_2$ concentration peak density;
implanting argon into said polysilicon material prior to the immediately preceding step, wherein said argon is implanted to form a argon concentration peak density at a location within the polysilicon material which is between said oxide and the location of said BF$_2$ concentration peak density for:
minimizing fluorine from said BF$_2$ from diffusing to said gate oxide;
further minimizing said fluorine from dislodging oxygen within said gate oxide; and
still further minimizing said dislodged oxygen from diffusing toward said silicon substrate and recombining with silicon at the juncture between said gate oxide and said substrate.

12. The method as recited in claim 11, wherein said step of implanting argon comprises further steps of:
ionizing elemental argon; and
accelerating the argon ions at a dose within the range of $1 \times 10^{13}$ atoms/cm$^2$ to $5 \times 10^{14}$ atoms/cm$^2$ at an implant energy less than 250 keV, whereby the first depth is approximately 2500 Å relative to the upper surface of said polysilicon.

13. The method as recited in claim 11, wherein said step of implanting impurities comprises further steps of:
ionizing said BF$_2$; and
accelerating the BF$_2$ ions at a dose within the range of $1 \times 10^{15}$ atoms/cm$^2$ to $8 \times 10^{15}$ atoms/cm$^2$ at an implant energy less than 80 keV, whereby the second depth is approximately 630 Å relative to the upper surface of said polysilicon.

* * * * *